US010337117B2

(12) United States Patent
Caspary et al.

(10) Patent No.: US 10,337,117 B2
(45) Date of Patent: Jul. 2, 2019

(54) METHOD OF MANUFACTURING A SILICON INGOT AND SILICON INGOT (71) Applicant: Infineon Technologies AG, Neubiberg (DE)

(72) Inventors: Nico Caspary, Munich (DE); Hans-Joachim Schulze, Taufkirchen (DE)

(73) Assignee: Infineon Technologies AG, Neubiberg (DE)

(*) Notice: Subject to any disclaimer, the term of this patent is extended or adjusted under 35 U.S.C. 154(b) by 539 days.

(21) Appl. No.: 14/535,416

(22) Filed: Nov. 7, 2014

(65) Prior Publication Data
US 2016/0130722 A1 May 12, 2016

(51) Int. Cl.
*C01B 33/00* (2006.01)
*C30B 15/04* (2006.01)
*C30B 29/06* (2006.01)
*C01B 33/02* (2006.01)

(52) U.S. Cl.
CPC ............ *C30B 15/04* (2013.01); *C01B 33/02* (2013.01); *C30B 29/06* (2013.01)

(58) Field of Classification Search
CPC ......... C30B 15/04; C30B 31/06; C30B 29/06; C01B 33/00; C01B 33/02
See application file for complete search history.

(56) References Cited

U.S. PATENT DOCUMENTS

| 2,861,905 A | 11/1958 | Indig et al. |
| 5,656,077 A | 8/1997 | Kawase |
| 5,976,247 A | 11/1999 | Hansen et al. |
| 6,179,914 B1* | 1/2001 | Aydelott ............... C30B 11/04 117/200 |
| 8,105,463 B2 | 1/2012 | Goulet et al. |
| 2011/0030793 A1 | 2/2011 | Kraiem et al. |
| 2011/0129784 A1 | 6/2011 | Bange et al. |
| 2012/0056135 A1 | 3/2012 | Deluca et al. |
| 2012/0301386 A1 | 11/2012 | Johnson et al. |
| 2014/0026617 A1* | 1/2014 | Yakub .................... C30B 33/04 65/31 |

FOREIGN PATENT DOCUMENTS

| CN | 1041011 A | 4/1990 |
| CN | 1649092 A | 8/2005 |
| CN | 101173369 A | 5/2008 |
| CN | 1032088407 A | 5/2008 |
| CN | 101654804 A | 2/2010 |

(Continued)

OTHER PUBLICATIONS

RU2023769, english translations.*

(Continued)

*Primary Examiner* — Melvin C Mayes
*Assistant Examiner* — Smita Patel
(74) *Attorney, Agent, or Firm* — Murphy, Bilak & Homiller, PLLC (57) ABSTRACT

A method of Czochralski growth of a silicon ingot includes melting a mixture of silicon material and an n-type dopant material in a crucible. The silicon ingot is extracted from the molten silicon during an extraction time period. The silicon ingot is doped with additional n-type dopant material during at least one sub-period of the extraction time period.

24 Claims, 4 Drawing Sheets (56) References Cited

FOREIGN PATENT DOCUMENTS

| | | | |
|---|---|---|---|
| CN | 101792933 A | 8/2010 | |
| CN | 101918314 A | 12/2010 | |
| CN | 102912424 A | 2/2013 | |
| CN | 102978698 A | 3/2013 | |
| CN | 103249875 A | 8/2013 | |
| CN | 103608496 A | 2/2014 | |
| DE | 1215658 B | 5/1966 | |
| DE | 3806918 A1 | 9/1989 | |
| DE | 102015100393 A1 | 7/2015 | |
| DE | 102014107590 B3 | 10/2015 | |
| GB | 921037 A | 3/1963 | |
| JP | H04243995 A | 9/1992 | |
| JP | 2012136398 A | 7/2012 | |
| RU | 2023769 | * 11/1994 | ............. C30B 15/04 |

OTHER PUBLICATIONS

Watanabe, Masahito, et al., "Silicon Crystal Growth by the Electromagnetic Czochralski (EMCZ) Method", Japanese Journal of Applied Physics, vol. 38, Part 2, No. 1A/B, Jan. 15, 1999, L10-L13.

* cited by examiner

METHOD OF MANUFACTURING A SILICON INGOT AND SILICON INGOT

BACKGROUND

Silicon wafers grown by the Czochralski (CZ) method, e.g., by the standard CZ method or by the magnetic CZ (MCZ) method or by the Continuous CZ (CCZ) method serve as a base material for manufacturing a variety of semiconductor devices and integrated circuits such as power semiconductor devices and solar cells. In the Czochralski method, silicon is heated in a crucible to the melting point of silicon at around 1416° C. to produce a melt of silicon. A small silicon seed crystal is brought in contact with the melt. Molten silicon freezes on the silicon seed crystal. By slowly pulling the silicon seed crystal away from the melt, a crystalline silicon ingot is grown with a diameter in the range of one or several 100 mm and a length in the range of a meter or more. In the MCZ method, additionally an external magnetic field is applied to reduce an oxygen contamination level.

Growing of silicon with defined doping by the Czochralski method is complicated by segregation effects. The segregation coefficient of a dopant material characterizes the relation between the concentration of the dopant material in the growing crystal and that of the melt. Typically, dopant materials have segregation coefficients lower than one meaning that the solubility of the dopant material in the melt is larger than in the solid. This typically leads to an increase of doping concentration in the ingot with increasing distance from the seed crystal.

Since in Czochralski grown silicon ingots, depending upon application of the grown silicon, a tolerance range of doping concentration or specific resistance along the axial direction between opposite ends of the silicon ingot may be smaller than the variability of doping concentration or specific resistance caused by segregation effects during CZ growth, different parts of the silicon ingot may be used as base materials having different target doping concentrations with overlapping, adjoining or spaced apart tolerance ranges of doping concentration or specific resistance. Such a partitioning of the silicon ingot is also known as order matching.

It is desirable to provide a silicon ingot and a method of manufacturing a silicon ingot grown by the Czochralski method enabling an improved yield with respect to silicon ingot parts having doping concentrations or specific resistances lying in acceptable tolerance ranges.

SUMMARY

According to an embodiment, a method of Czochralski growth of a silicon ingot is disclosed. The method comprises melting a mixture of silicon material and an n-type dopant material in a crucible. The silicon ingot is extracted from the molten silicon during an extraction time period. The method further comprises doping the silicon ingot with additional n-type dopant material during at least one sub-period of the extraction time period.

According to an embodiment, an n-doped silicon ingot is disclosed. A specific resistance $\rho$ of the n-doped silicon ingot, along an axis between opposite ends of the silicon ingot, has at least one point of inflection where a concavity of the specific resistance $\rho$ changes along the axis.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having," "containing," "including," "comprising" and the like are open and the terms indicate the presence of stated structures, elements or features but not preclude the presence of additional elements or features. The articles "a," "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n−"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
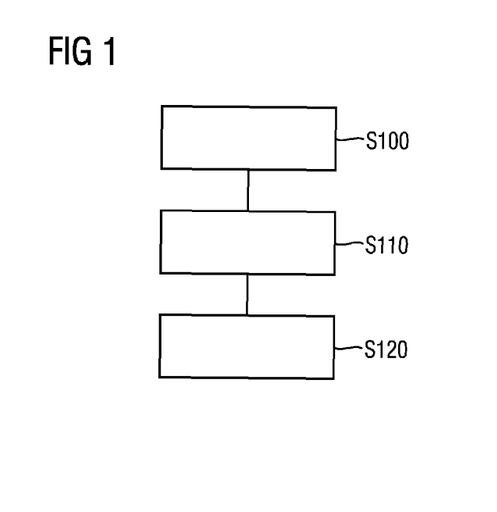
FIG. 1 is a schematic flow chart for illustrating a method of manufacturing an n-type silicon ingot.

FIG. 1 refers to a method of manufacturing a silicon ingot.

Process feature S100 of the method includes melting a mixture of silicon material and an n-type dopant material in a crucible.

Process feature S110 of the method includes extracting the silicon ingot from the molten silicon over an extraction time period.

Process feature S120 of the method includes doping the silicon ingot with additional n-type dopant material during at least one sub-period of the extraction time period.

Figure 2:
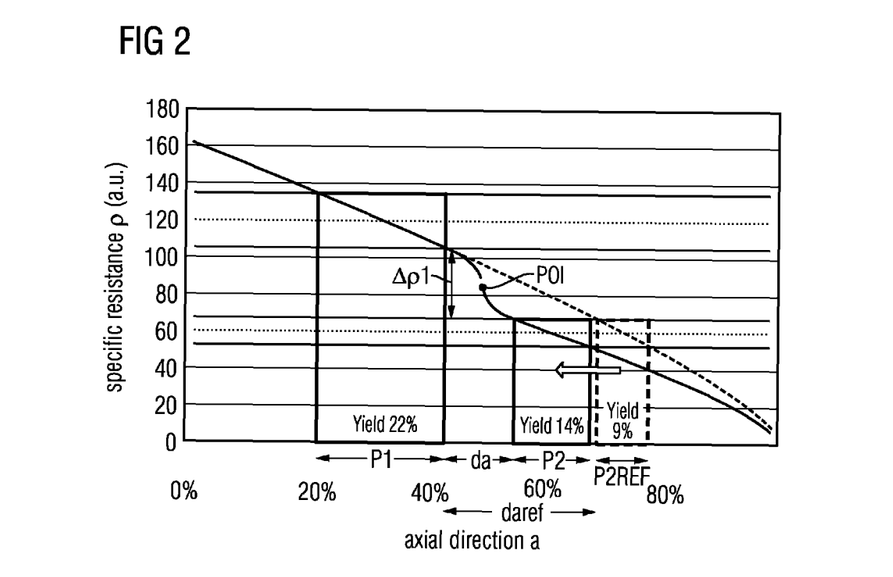
FIG. 2 is a graph illustrating a specific resistance $\rho$ versus an axial direction a of a silicon ingot grown by the method of FIG. 1.

By doping the silicon ingot with the additional n-type dopant material during at least one sub-period of the extraction time period, manufacturing of at least two ingot parts having different target specifications of specific resistance ρ, also known as order matching, can be improved as is illustrated in the schematic graph of FIG. 2. The schematic graph of FIG. 2 illustrates a specific resistance ρ of a silicon ingot versus an axial direction a. Growth of the silicon ingot started at the axial position 0%. Due to segregation effects during growth of the n-type silicon ingot, a negative slope of the specific resistance increases toward and end of the silicon ingot. By temporary doping with the additional n-type dopant material after growth of a first silicon ingot part P1 fulfilling a first target specification of specific resistance, an axial distance da between the first silicon ingot part P1 and a second silicon ingot part P2 fulfilling a different target specification of specific resistance can be decreased compared with a second reference ingot part P2REF grown without doping with the additional n-type dopant material. The temporary doping with the additional n-type dopant material leads to an increase of the negative slope of the specific resistance along an axial direction of the silicon ingot. By carrying out the doping with the additional n-type dopant material in a specific resistance range Δρ1 between the first and second target specifications, an axial distance da between the first and second silicon ingot parts P1, P2 fulfilling the first and second target specifications can be shortened compared to an axial distance daref between the first ingot part P1 and the second reference ingot part P2REF. In other words, the second silicon ingot part P2 is shifted toward an origin of the silicon ingot. Since the negative slope of the specific resistance ρ decreases along the axial direction a toward the origin of the silicon ingot due to segregation effects, an extension of the second silicon ingot part P2 fulfilling the second target specification can be increased compared to the second reference ingot part P2REF, thereby improving the yield.

According to an embodiment, the additional n-type dopant material is phosphorus.

According to another embodiment, the silicon ingot is doped with the additional n-type dopant material by a vapor phase doping technique. An embodiment includes controlling inlet of a dopant precursor gas into a reaction chamber including the silicon ingot. Phosphine ($PH_3$) and arsine ($AsH_3$) are examples for precursor gases for n-type doping of silicon.

According to another embodiment, doping the silicon ingot with the additional n-type dopant material includes melting an n-type dopant source material in the crucible. The silicon ingot may be doped with the additional n-type dopant material by adjusting a depth of the n-type dopant source material into the molten silicon, the n-type dopant source material including the additional n-type dopant material. Adjusting the depth of the n-type dopant source material dipped into the molten silicon in the crucible may include measuring a weight of the n-type dopant source material.

According to another embodiment, the n-type dopant source material is in the shape of one or more rods. The one or more rods may be dipped into the silicon melt by a puller mechanism. The puller mechanism holds the n-type dopant source material, dips the n-type dopant source material into the silicon melt and also pulls the dopant source material out of the silicon melt. A control mechanism is configured to control the puller mechanism. The control mechanism may control the puller mechanism by wired or wireless control signal transmission, for example.

According to an embodiment, the n-type dopant source material is made of quartz or silicon carbide doped with the additional n-type dopant material. A concentration profile of the additional n-type dopant material into a depth of the n-type dopant source material may have a peak below a surface of the n-type dopant source material. Introducing the n-type dopant material into the n-type dopant source material may be carried out by at least one of the processes in-situ doping, plasma deposition through a surface of the n-type dopant source material, ion implantation through the surface of the n-type dopant source material and diffusion through the surface of the n-type dopant source material. Adding the n-type dopant source material having a peak below a surface of the n-type dopant source material leads to a delay in adding additional n-type dopants to the melt depending on a depth profile of doping and a melting rate of the n-type dopant source material.

According to an embodiment, a degree of doping the silicon ingot with the additional n-type dopant material during the extraction time period is varied between no doping and maximum doping. Doping of the silicon ingot with the additional n-type dopant material may be suppressed by stopping additional n-type dopants entering the molten silicon, for example by moving out the n-type dopant source material, e.g., a rod from the molten silicon via the puller mechanism or by stopping inlet of the dopant precursor gas into the reaction chamber including the silicon ingot.

According to an embodiment, a net n-type doping in the silicon ingot is set between $1 \times 10^{13}$ cm$^{-3}$ and $1 \times 10^{15}$ cm$^{-3}$. Raw material, for example wafers for power semiconductors such as IGBTs, diodes, insulated gate field effect transistors (IGFETs) and thyristors may have a net n-type doping range between $1 \times 10^{13}$ cm$^{-3}$ and $1 \times 10^{15}$ cm$^{-3}$, for example.

According to another embodiment, the silicon ingot is doped with p-type dopant material by adding the p-type dopant material to the silicon melt via at least one of a p-type dopant source material or by a vapor phase doping technique. According to an embodiment, the p-type dopant material is one of boron, aluminum and gallium. Doping with p-type dopant material leads to a partial compensation of the n-type doping. Due to different segregation of the n- and p-type dopants, a further decrease of the negative slope of specific resistance along the axial direction a can be achieved. When adding the p-type dopants in a growth period of the first and second ingot parts P1, P2, the negative slope decrease falls within these periods. Thereby, an extension of the first and second ingot parts P1, P2 along the axial direction a can be increased, leading to an improved yield. Since the method described above allows for a shift of silicon ingot parts of specified specific resistance along the axial direction, other characteristics of silicon ingot parts varying along the axial direction, for example oxygen content, may be adjusted by appropriately shifting the target silicon ingot parts along the axial direction.

According to an embodiment, the silicon ingot is doped with the p-type dopant material by a vapor phase doping technique.

According to another embodiment, doping the silicon ingot with the p-type dopant material includes melting a p-type dopant source material in the crucible. The silicon ingot may be doped with the p-type dopant material by adjusting a depth of the p-type dopant source material into the molten silicon, the p-type dopant source material including the p-type dopant material. Adjusting the depth of the p-type dopant source material dipped into the molten silicon in the crucible may include measuring a weight of the p-type dopant source material. The p-type dopant source material may be in the shape of one or more rods. The p-type dopant source material may be made of quartz or silicon carbide doped with the additional n-type dopant material. A concentration profile of the p-type dopant material into a depth of the p-type dopant source material may have a peak below a surface of the p-type dopant source material. The p-type dopant material may be introduced into the p-type dopant source material by at least one of the processes in-situ doping, plasma deposition through a surface of the p-type dopant source material, ion implantation through the surface of the p-type dopant source material and diffusion through the surface of the p-type dopant source material. A degree of doping the silicon ingot with the additional n-type dopant material during the extraction time period may be altered between no doping and maximum doping.

Figure 3:
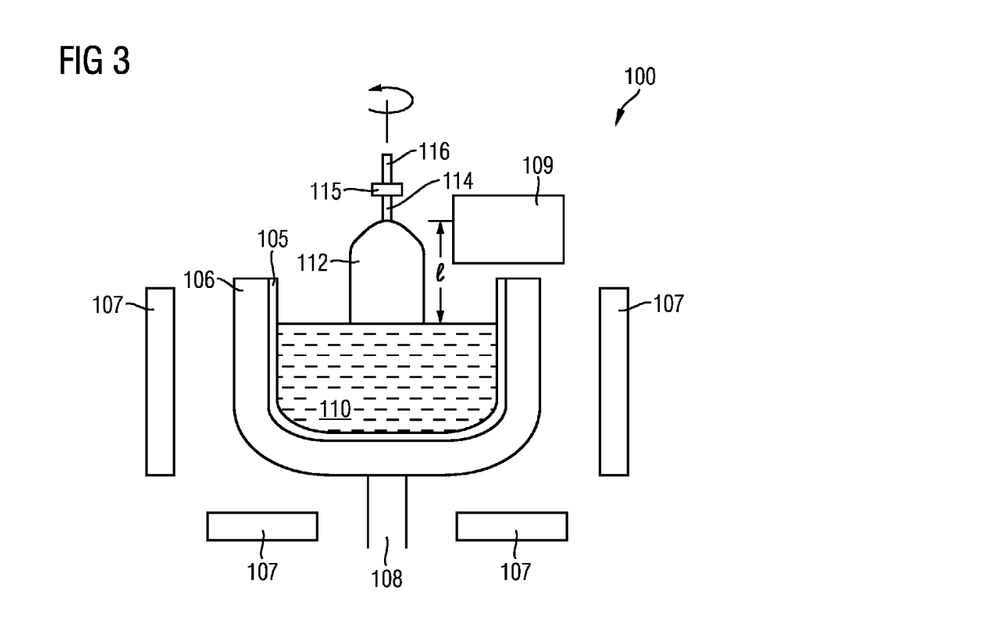
FIG. 3 is a schematic cross-sectional view of a CZ growth system for carrying out the method illustrated in FIG. 1.

FIG. 3 is a simplified schematic cross-sectional view of a CZ growth system 100 for carrying out the method illustrated in FIG. 1.

The CZ growth system 100 includes a crucible 105, e.g., a quartz crucible on a crucible support 106, e.g., a graphite susceptor. A heater 107, e.g., a radio frequency (RF) coil surrounds the crucible. The heater 107 may be arranged at lateral sides and/or at a bottom side of the crucible 105. The crucible 105 may be rotated by a supporting shaft 108.

The mixture of silicon material, e.g., a non-crystalline raw material such as polysilicon and an n-type dopant material such as phosphorus (P), antimony (Sb), arsenic (As) or any combination thereof is melted in the crucible by heating via the heater 107. The n-type dopant material may already constitute or be part of the initial doping of the silicon material to be melted and/or may be added as a solid, liquid or gaseous dopant source material. According to an embodiment, the solid dopant source material is a dopant source particle such as a dopant source pill. The dopant source material may have a predetermined shape such as a disc shape, spherical shape or a cubic shape. By way of example, the shape of the dopant source material may be adapted to a supply device 109 such as a dispenser configured to supply the dopant source material to a silicon melt 110 in the crucible 105.

According to an embodiment, the dopant source material may include, in addition to the dopant material, a carrier material or a binder material. By way of example, the dopant source material may be quartz or silicon carbide (SiC) doped with the dopant material. According to another embodiment, the dopant source material may be a highly doped silicon material such as a highly doped polysilicon material that is doped to a greater extent than the silicon raw material. According to yet another embodiment, the dopant source material may be boron nitride and/or boron carbide.

A silicon ingot 112 is pulled out of the crucible 105 containing the silicon melt 110 by dipping a seed crystal 114 into the silicon melt 110 which is subsequently slowly withdrawn at a surface temperature of the melt just above the melting point of silicon. The seed crystal 114 is a single crystalline silicon seed mounted on a seed support 115 rotated by a pull shaft 116. A pulling rate which typically is in a range of a few mm/min and a temperature profile influence a diameter of the CZ grown silicon ingot 112.

When extracting the silicon ingot 112 with the CZ growth system 100 according to the method illustrated in FIG. 1, the additional n-type dopant material is added to the silicon melt during at least one sub-period of the extraction time.

According to an embodiment, the additional n-type dopant material is temporarily added to the molten silicon from a doped quartz material such as a phosphorus doped quartz material supplied to the silicon melt 110 by the supply device 109.

Figure 4:
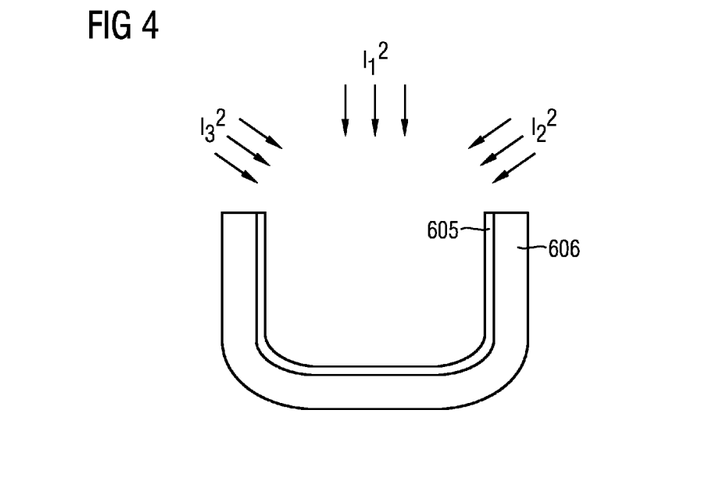
FIG. 4 is a schematic cross-sectional view of a crucible for illustrating a method of doping the crucible with dopant material.

According to another embodiment, the additional n-type dopant material is added to the silicon melt 100 from a doped crucible. The crucible doped with additional n-type dopant material may be formed by implanting the additional n-type dopant material, for example phosphorus into the crucible, (cf. schematic cross-sectional view of FIG. 4). The additional n-type dopant material may be implanted into the crucible 105 by one or more tilted implants, cf. labels $I_2^2$ and $I_3^2$ and/or by non-tilted implant, cf. label $I_1^2$ in FIG. 4. A distribution of tilt angle(s) may be used to adjust the amount of the additional n-type dopant material that is supplied to the silicon melt 110 by dissolving a material of the crucible 105 in the silicon melt 110, e.g., at a rate in the range of approximately 10 µm/hour in case of a crucible made of quartz. The additional n-type dopant material may be implanted into the crucible at various energies and/or at various doses. Applying a thermal budget to the crucible 105 by heating may allow for setting a retrograde profile of the additional n-type dopant material in the crucible 105. Multiple implants at various energies and/or doses further allow for setting a profile of the additional n-type dopant material into a depth of the crucible 105. Thus, a rate of adding the additional n-type dopant material into the silicon melt 110 may be adjusted, i.e. by selection of implantation parameters the rate of the addition of the additional n-type dopant material can be varied and controlled in a well-defined manner. By way of example, the profile of the additional n-type dopant material in the crucible 105 may be a retrograde profile. As an alternative or in addition to implanting the additional n-type dopant material into the crucible 105, the additional n-type dopant material may also be introduced into the crucible 105 by another process, e.g., by diffusion from a diffusion source such as a solid diffusion source of the additional n-type dopant material, for example. As a further alternative or in addition to the above processes of introducing the additional n-type dopant material into the crucible 105, the additional n-type dopant material may also be introduced into the crucible 105 in-situ, i.e., during formation of the crucible 105.

According to yet another embodiment the additional n-type dopant material may be introduced into the silicon melt 110 from the gas phase, e.g., by supply of phosphine (PH$_3$) as a precursor gas for n-type doping of silicon via the supply device 109. According to an embodiment, supply of boron in the gas phase may occur via a supply of inert gas into the CZ growth system 100. According to another embodiment, supply of additional n-type dopant material in the gas phase may occur via one or more tubes, e.g., a quartz tube extending into the silicon melt 110. According to yet another embodiment, supply of the additional n-type dopant material in the gas phase may occur via one or more tubes ending at a short distance to the silicon melt 110. The tubes may include one or more openings at an outlet, e.g., in the form of a showerhead, for example.

According to another embodiment, a liner layer may be formed on the crucible 105 for controlling diffusion of the additional n-type dopant material out of the crucible 105 into the silicon melt 110. As an example, the liner layer may be formed of quartz and/or silicon carbide. According to an embodiment, the liner layer may be dissolved in the silicon melt 100 before the additional n-type dopant material included in the crucible gets dissolved in the silicon melt 110 and serves as a dopant during the growth process of the silicon ingot 112. This allows for adjusting a point of time when the additional n-type dopant material is available in the silicon melt as a dopant to be introduced into the silicon ingot 112. The liner layer may also delay introduction of the additional n-type dopant material into the silicon melt 110 by a time period that is required for diffusion of the additional n-type dopant material from the crucible 105 through the liner layer and into the silicon melt 110.

According to another embodiment, the method of manufacturing the silicon ingot 112 further includes altering a rate of adding the additional n-type dopant material to the silicon melt 110. According to an embodiment, altering the rate of adding the additional n-type dopant material to the silicon melt 110 includes altering at least one of size, geometry, and rate of delivery of particles including the additional n-type dopant material. By way of example, the rate may be increased by increasing a diameter of the particles doped with the dopant material. As an additional or alternative measure, the rate of adding the additional n-type dopant material to the silicon melt 110 may be increased by increasing a speed of supplying the dopant source material into the silicon melt 110 by the supply device 109.

Figure 5:
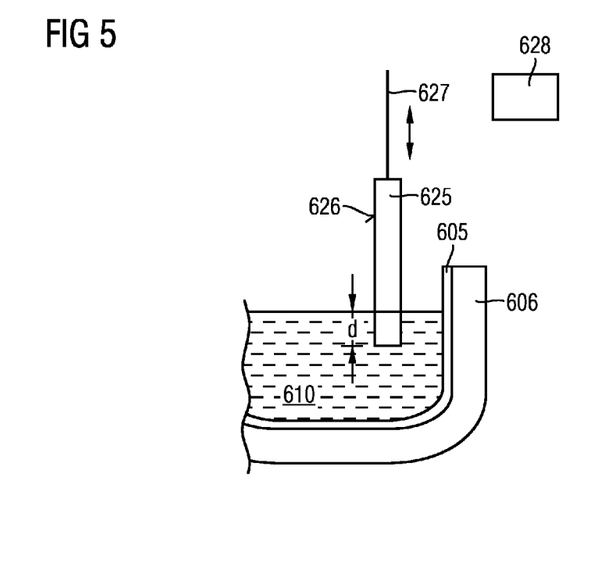
FIG. 5 is a schematic cross-sectional view of a part of a CZ growth system for illustrating a method of adding dopants to a silicon melt in the crucible.

According to another embodiment illustrated in the schematic cross-sectional view of FIG. 5, altering the rate of adding the additional n-type dopant material to the silicon melt 110 includes altering a depth d of a dopant source material 125 dipped into the silicon melt 110.

According to another embodiment, altering the rate of adding the additional n-type dopant material to the silicon melt 110 includes altering a temperature of the dopant source material 125. By way of example, by increasing a temperature of the dopant source material, e.g., by heating, the amount of the additional n-type dopant material introduced into the silicon melt 110 out of the dopant source material 125 may be increased. The dopant source material 125 is doped with the additional n-type dopant material. According to an embodiment, doping of the dopant source material is carried out by one of in-situ doping, by a plasma deposition process through a surface 126 of the dopant source material 125, by ion implantation through the surface 126 of the dopant source material 125 and by a diffusion process through the surface 126 of the dopant source material 125. The dopant source material 125 may be shaped as a bar, a cylinder, a cone or a pyramid, for example. The dopant source material 125 may also be made of a plurality of separate dopant source pieces having one or a combination of different shapes. The depth d of a part of the dopant source material 125 that is dipped into the silicon melt 110 may be changed by a puller mechanism 127. The puller mechanism 127 holds the dopant source material 125, dips the dopant source material 125 into the silicon melt 110 and also pulls the dopant source material 125 out of the silicon melt 110. A control mechanism 128 is configured to control the puller mechanism 127. The control mechanism 128 may control the puller mechanism 127 by wired or wireless control signal transmission, for example.

According to another embodiment, altering the rate of adding the additional n-type dopant material to the silicon melt 110 includes altering a flow or partial pressure of a precursor gas, e.g., phosphine (PH$_3$) when doping the silicon melt 110 with boron from the gas phase.

The method for manufacturing the silicon ingot 112 described above leads to an improved order matching of at least two ingot parts having different target specifications of specific resistance ρ.

Partial counter-doping with p-type dopant material may be carried out by similar techniques as described above with respect to additional n-type doping. Doping with p-type dopant material leads to a partial compensation of the n-type doping. Due to different segregation of the n- and p-type dopants, a further decrease of the negative slope of specific resistance along the axial direction can be achieved. When adding the p-type dopants in a growth period of ingot parts falling into a specified range of target specific resistance, an extension of these ingot parts along the axial direction can be increased, leading to an improved yield. Further details on decreasing the negative slope of specific resistance along the axial direction is given below.

An axial profile of doping caused by segregation of dopant material during CZ growth can be approximated by equation (1) below:

$$c(p) = k_0 c_0 (1-p)^{k_0-1} + F_0 \frac{k_0}{1-k_0}[(1-p)^{k_0-1} - 1] \quad (1)$$

The first term in the equation (1) refers to a doping that has been added to the melt before extracting the silicon ingot from the melt. According to the above embodiments, a basic n-type dopant material may be described by the first term of equation (1). The second term refers to adding dopant material at a constant rate into the melt during CZ growth. According to the above embodiments, adding the boron or another additional dopant material may be described by the second term of equation (1).

In the above equation (1), c(p) denotes a concentration of the dopant material in the silicon ingot (atoms/cm$^3$), p denotes a portion of the initial melt during CZ growth that has been crystallized and corresponds to an axial position between 0% and 100% of the completely grown silicon ingot, $k_0$ denotes a segregation coefficient of the dopant material, e.g., approx. 0.8 for boron (B) in silicon and approx. 0.35 for phosphorus (P) in silicon, $c_0$ denotes an initial concentration of the dopant material in the melt (atoms/cm$^3$) and $F_0$ denotes a total amount of the dopant material that is constantly (relative to the pulling rate) added to the melt divided by the initial volume of the melt (atoms/cm$^3$).

Figure 6:
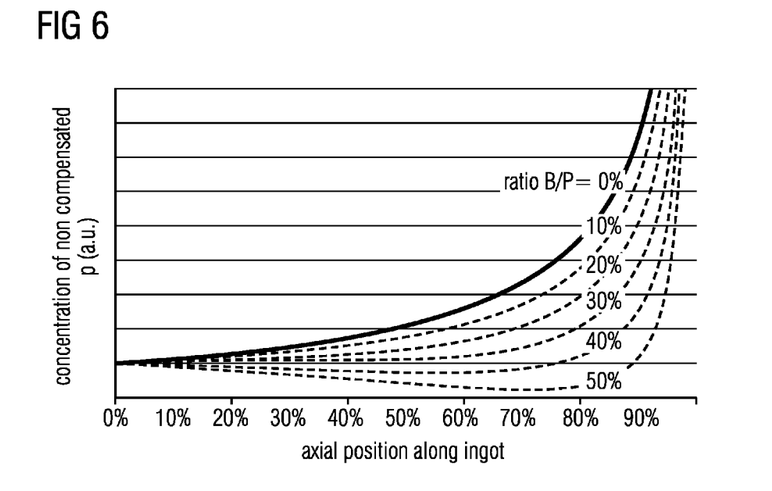
FIG. 6 is a graph illustrating a simulated concentration of non-compensated phosphorus along an axial position of a CZ grown silicon ingot with respect to different ratios of boron and phosphorus added to the silicon melt.

FIG. 6 illustrates calculated concentrations of non-compensated phosphorus (P), i.e., net n-doping versus an axial position between opposite ends of a silicon ingot. The illustrated curves refer to different ratios of boron (B) and phosphorus (P), i.e., $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

The illustrated curves refer to values of $F_{OB}/c_{OP}$ of 0%, 10%, 20%, 30%, 40%, 50%.

Figure 7:
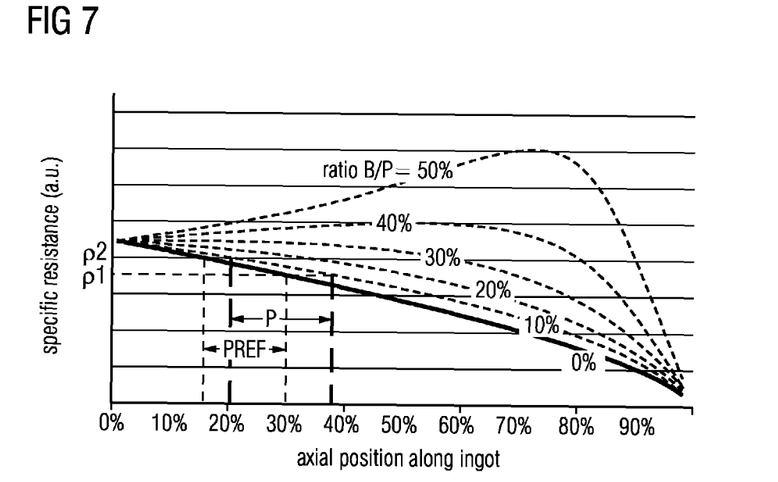
FIG. 7 is a graph illustrating a simulated specific resistance along an axial position of a CZ grown silicon ingot with respect to different ratios of boron and phosphorus added to the silicon melt.

FIG. 7 illustrates calculated specific resistance curves versus an axial position between opposite ends of a silicon ingot. Similar to the parameter curves illustrated in FIG. 6, the curves illustrated in FIG. 7 refer to different ratios of boron (B) and phosphorus (P), i.e., FoB/cop corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$).

Similar to the parameter curves illustrated in FIG. 6, the curves illustrated in FIG. 7 refer to values of $F_{OB}/c_{OP}$ of 0%, 10%, 20%, 30%, 40%, 50%. By adding boron to the melt during CZ growth and thereby adding a compensation dopant to the melt during the CZ growth, the method described with reference to FIGS. 1 to 5 allows for a reduction of a negative slope of the specific resistance along the axial direction between opposite ends of the silicon ingot. Since use of silicon ingots for supplying wafers for manufacturing a semiconductor device may require small tolerances with respect to the specific resistance, e.g., for manufacturing of insulated gate bipolar transistors (IGBTs), for example, the method described with reference to FIGS. 6 and 7 allows for yield improvement. An axial length PREF of a silicon ingot part without p-type counter-doping falling in a specific resistance range between $\rho_1$ and $\rho_2$ is smaller than an axial length P a silicon ingot part with 10% p-type counter-doping falling in the specific resistance range between $\rho_1$ and $\rho_2$.

Based on the method illustrated and described with respect to FIGS. 1 to 7, table 1 illustrates a maximum portion of the ingot along the axial direction having a specific fluctuation of specific resistance and a specific ratio of boron (B) and phosphorus (P), i.e. $F_{OB}/c_{OP}$ corresponding to the ratio of the total amount of boron that is constantly (relative to the pulling rate) added to the silicon melt divided by the initial volume of the melt ($F_{OB}$ in atoms/cm$^3$) and an initial concentration of phosphorus in the melt ($c_{OP}$ in atoms/cm$^3$). Table 1 refers to values of $F_{OB}/c_{OP}$ of 0%, 10%, 20%, 30%, 40%, 50%, and to axial fluctuations of the specific resistance of +/−5%, +/−10%, +/−15%, +/−20%, +/−30%, +/−50%. By adding boron to the melt during CZ growth and thereby adding a compensation dopant to the melt during the CZ growth, the method described with reference to FIGS. 1 to 6 allows for a yield improvement by increasing the maximum portion of the ingot along the axial direction having a specific fluctuation of specific resistance. As an example, the axial portion of the ingot having a fluctuation of specific resistance of +/−10% may be increased from 26% (no compensation doping) to 78% (compensation doping $F_{OB}/c_{OP}$ of 40%).

TABLE 1

| boron compensation flow/initial doping with phosphorous | maximum ingot length with axial fluctuation of specific resistance of | | | | | |
|---|---|---|---|---|---|---|
| | +/−5% | +/−10% | +/−15% | +/−20% | +/−30% | +/−50% |
| no compensation | 14% | 26% | 36% | 46% | 60% | 80% |
| 20% | 32% | 48% | 58% | 66% | 76% | 88% |
| 30% | 56% | 66% | 74% | 78% | 84% | 92% |
| 35% | 66% | 74% | 78% | 82% | 86% | 92% |
| 40% | 38% | 78% | 82% | 84% | 88% | 92% |
| 45% | 22% | 44% | 84% | 86% | 88% | 94% |

According to the method illustrated with respect to FIGS. 6 to 7, boron is constantly added (relative to the pulling rate) to the silicon melt (described by the term $F_{OB}$ in atoms/cm$^3$) and phosphorus is added as an initial concentration to the melt (described by the term $c_{OP}$ in atoms/cm$^3$). According to other embodiments, boron may be added to the melt at an altering rate. Apart from or in addition to phosphorus, the additional n-type dopant material such as phosphorus, antimony or arsenic may added in ingot growth intervals between ingot parts falling into a specific target resistance as is illustrated and described with respect to FIGS. 1 and 2, for example.

In addition to adding boron to the melt during CZ growth a part of the overall boron may also be added to the melt before CZ growth which may be described by a term cop in equation (1). Likewise, in addition to adding phosphorus or the another n-type dopant material as an initial concentration to the melt, a part of the phosphorus or the additional n-type dopant material may also be added to the melt during CZ growth which may be described by a term FOP in equation (1) in case of constantly adding the phosphorus or the other n-type dopant material relative to the pulling rate.

According to an embodiment of a silicon ingot, a specific resistance ρ, along an axis between opposite ends of the silicon ingot, has at least one point of inflection POI where a concavity of the specific resistance ρ changes along the axis as is illustrated in the graph of FIG. 2.

According to an embodiment, a net n-type doping in the silicon ingot is between $1\times10^{13}$ cm$^{-3}$ and $1\times10^{15}$ cm$^{-3}$.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of magnetic Czochralski (MCZ) growth of a silicon ingot, the method comprising:
   melting a mixture of silicon material and an n-type dopant material in a crucible;
   extracting the silicon ingot from the molten mixture during an extraction time period by the MCZ growth, thereby doping the silicon ingot with the n-type dopant material of the molten mixture; and
   doping the silicon ingot with additional n-type dopant material during at least one sub-period of the extraction time period, wherein the silicon ingot comprises a first silicon ingot part and a second silicon ingot part, wherein doping the silicon ingot with additional n-type doping material is in addition to doping the silicon ingot with the n-type dopant material of the molten mixture, and wherein doping the silicon ingot with the additional n-type doping material starts after the first silicon ingot part has been grown and ends before the second silicon ingot part is grown.

2. The method of claim 1, wherein the additional n-type dopant material is phosphorus.

3. The method of claim 1, wherein the silicon ingot is doped with the additional n-type dopant material by a vapor phase doping technique.

4. The method of claim 3, further comprising controlling inlet of a dopant precursor gas into a reaction chamber including the silicon ingot.

5. The method of claim 1, wherein doping the silicon ingot with the additional n-type dopant material includes melting an n-type dopant source material in the crucible.

6. The method of claim 5, wherein the silicon ingot is doped with the additional n-type dopant material by adjusting a depth of the n-type dopant source material into the molten silicon, the n-type dopant source material including the additional n-type dopant material.

7. The method of claim 6, wherein adjusting the depth of the n-type dopant source material dipped into the molten silicon in the crucible includes measuring a weight of the n-type dopant source material.

8. The method of claim 5, wherein the n-type dopant source material is in the shape of one or more rods.

9. The method of claim 5, wherein the n-type dopant source material is made of quartz or silicon carbide doped with the additional n-type dopant material.

10. The method of claim 5, wherein a concentration profile of the additional n-type dopant material into a depth of the n-type dopant source material has a peak below a surface of the n-type dopant source material.

11. The method of claim 10, wherein introducing the n-type dopant material into the n-type dopant source material is carried out by at least one of the processes in-situ doping, plasma deposition through a surface of the n-type dopant source material, ion implantation through the surface of the n-type dopant source material and diffusion through the surface of the n-type dopant source material.

12. The method of claim 1, further comprising altering a degree of doping the silicon ingot with the additional n-type dopant material during the extraction time period between no doping and maximum doping.

13. The method of claim 1, further comprising setting a net n-type doping in the silicon ingot between $1\times10^{13}$ cm$^{-3}$ and $1\times10^{15}$ cm$^{-3}$.

14. The method of claim 1, further comprising partially counter-doping the silicon ingot with p-type dopant material by adding the p-type dopant material to the silicon melt via at least one of a p-type dopant source material or by a vapor phase doping technique.

15. The method of claim 14, wherein the p-type dopant material is at least one of boron, aluminum and gallium.

16. The method of claim 14, wherein the silicon ingot is doped with the p-type dopant material by a vapor phase doping technique.

17. The method of claim 14, wherein doping the silicon ingot with the p-type dopant material includes melting a p-type dopant source material in the crucible.

18. The method of claim 17, wherein the silicon ingot is doped with the p-type dopant material by adjusting a depth of the p-type dopant source material into the molten silicon, the p-type dopant source material including the additional n-type dopant material.

19. The method of claim 17, wherein adjusting the depth of the p-type dopant source material dipped into the molten silicon in the crucible includes measuring a weight of the p-type dopant source material.

20. The method of claim 17, wherein the p-type dopant source material is in the shape of one or more rods.

21. The method of claim 17, wherein the p-type dopant source material is made of quartz or silicon carbide doped with the additional n-type dopant material.

22. The method of claim 17, wherein a concentration profile of the p-type dopant material into a depth of the p-type dopant source material has a peak below a surface of the p-type dopant source material.

23. The method of claim 17, wherein introducing the p-type dopant material into the p-type dopant source material is carried out by at least one of the processes in-situ doping, plasma deposition through a surface of the p-type dopant source material, ion implantation through the surface of the p-type dopant source material and diffusion through the surface of the p-type dopant source material.

24. The method of claim 17, further comprising altering a degree of doping the silicon ingot with the additional n-type dopant material during the extraction time period between no doping and maximum doping.

* * * * *

UNITED STATES PATENT AND TRADEMARK OFFICE
CERTIFICATE OF CORRECTION

PATENT NO. : 10,337,117 B2
APPLICATION NO. : 14/535416
DATED : July 2, 2019
INVENTOR(S) : N. Caspary et al.

Page 1 of 1

It is certified that error appears in the above-identified patent and that said Letters Patent is hereby corrected as shown below:

On the Title Page

Item [56], change "english" to -- English --

In the Claims

Column 10, Line 61 Claim 1, Line 5 change "from the" to -- from a --

Signed and Sealed this
Tenth Day of September, 2019

Andrei Iancu
*Director of the United States Patent and Trademark Office*